(12) United States Patent
Huang

(10) Patent No.: US 12,212,312 B1
(45) Date of Patent: Jan. 28, 2025

(54) HALF-BRIDGE CIRCUIT DRIVING CHIP

(71) Applicant: Motor Semiconductor Co., Ltd., Hsinchu County (TW)

(72) Inventor: Kuo-Lun Huang, Hsinchu (TW)

(73) Assignee: MOTOR SEMICONDUCTOR CO., LTD., Hsinchu County (TW)

( * ) Notice: Subject to any disclaimer, the term of this patent is extended or adjusted under 35 U.S.C. 154(b) by 11 days.

(21) Appl. No.: 18/375,641

(22) Filed: Oct. 2, 2023

(51) Int. Cl.
  *H03K 17/22* (2006.01)
  *H03K 19/0185* (2006.01)
(52) U.S. Cl.
  CPC ..... *H03K 17/22* (2013.01); *H03K 19/018507* (2013.01)
(58) Field of Classification Search
  None
  See application file for complete search history.

(56) References Cited

U.S. PATENT DOCUMENTS 11,329,635 B1 * 5/2022 Dahlhaus ............ H03K 5/00006
11,855,618 B2 * 12/2023 Akiyama ............. H03K 17/687

* cited by examiner

*Primary Examiner* — Jeffrey S Zweizig
(74) *Attorney, Agent, or Firm* — WPAT, PC

(57) ABSTRACT

A half-bridge circuit driving chip includes a control module, a level shift unit, a programming module, and a driving unit. The control module is configured to receive an enabling signal and an input signal, and output a set signal and a reset signal. The level shift unit is configured to receive the set signal and the reset signal, and output a relative set signal and a relative reset signal. When the enabling signal is at a low level, the half-bridge circuit driving chip is in a programming mode, and the programming module performs decoding according to the relative set signal and the relative reset signal, and outputs a circuit parameter. When the enabling signal is at a high level, the half-bridge circuit driving chip is in a working mode, and the driving unit generates an output signal according to the relative set signal and the relative reset signal.

11 Claims, 12 Drawing Sheets

HALF-BRIDGE CIRCUIT DRIVING CHIP

BACKGROUND OF THE INVENTION

1. Field of the Invention

The present invention relates to an electronic element and, more particularly, to a half-bridge circuit driving chip configured to switch into a programming mode in the chip and decode and adjust in a high-side circuit.

2. Description of the Related Art

A half-bridge circuit is formed by electrically connecting a driving chip with a high-side switch, a low-side switch, and a power supply. The half-bridge circuit may receive an input signal through the driving chip and switch the high-side switch and the low-side switch to be on or off according to a signal level. The input signal may be a pulse width modulation (PWM) signal, used for controlling the switches to alternately connected to the power supply, and output a square wave signal at a load end electrically connected to the high-side switch and the low-side switch. The half-bridge circuit has the advantages of low cost and easiness in operation and control.

The conventional half-bridge circuit may switch high voltage and low voltage at the load end, but has more complex operation functions, such as dead-time control, undervoltage lockout, overcurrent protection, overtemperature protection, and driver strength control. It is needed to electrically connect external electronic elements to the half-bridge circuit to perform the operations of decoding, adjusting, programming circuit parameters, and the like. Thus, problems such as increased number of elements needed to be connected to the driving chip, increased energy consumption of the whole circuit, and complex operation functions have arisen.

Therefore, it is necessary to improve the conventional half-bridge circuit driving chip.

SUMMARY OF THE INVENTION

To solve the above problem, it is an objective of the present invention to provide a half-bridge circuit driving chip, and a programming module may be integrated in the chip.

It is another objective of the present invention to provide a half-bridge circuit driving chip to reduce the number of pins.

It is yet another objective of the present invention to provide a half-bridge circuit driving chip to reduce the energy consumption of the chip.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

A half-bridge circuit driving chip according to the present invention includes a control module, a level shift unit, a programming module, and a driving unit. The control module is configured to receive an enabling signal and an input signal, and output a set signal and a reset signal. The level shift unit is coupled with the control module. The level shift unit is configured to receive the set signal and the reset signal, and output a relative set signal and a relative reset signal. The programming module is coupled with the level shift unit. When the enabling signal is at a low level, the half-bridge circuit driving chip is in a programming mode, and the programming module performs decoding according to the relative set signal and the relative reset signal, and outputs a circuit parameter. The circuit parameter remains unchanged when the enabling signal is at a high level. The driving unit is coupled with the level shift unit. When the enabling signal is at the high level, the half-bridge circuit driving chip is in a working mode, and the driving circuit generates an output signal according to the relative set signal and the relative reset signal. The output signal is maintained at the low level when the enabling signal is at the low level.

Therefore, according to the half-bridge circuit driving chip in the present invention, programming signals are transmitted to the high-side circuit of the chip through the level shift unit, and the programming module is integrated in the high-side circuit to adjust and program the high-side circuit parameters. The chip performs decoding the programming signals in the input signal in the programming mode and switching the high-side switch on or off in the working mode, respectively. Accordingly, extra pins and electrical connection with external electronic elements are not needed, thereby achieving the effects of reducing the number of pins, reducing energy consumption of the chip, and reducing the complexity of a half-bridge circuit.

In an example, the control module is provided with a pulse control unit coupled with a set unit and a reset unit, respectively, and the pulse control unit generates a positive edge pulse signal and a negative edge pulse signal according to the input signal. The control module transmits the positive edge pulse signal and the negative edge pulse signal to the set unit and the reset unit, respectively. Thus, pulse signals may be generated at the positive edge and negative edge of the input signals, thereby achieving the effect of switching the switch on or off.

In an example, the set unit receives the input signal, the enabling signal, and the positive edge pulse signal. When the enabling signal is at the low level, the set signal outputted by the set unit is the input signal, and when the enabling signal is at the high level, the set signal is the positive edge pulse signal. The reset unit receives the enabling signal and the negative edge pulse signal, when the enabling signal is at the low level, the reset signal outputted by the reset unit is maintained at the high level, and when the enabling signal is at the high level, the reset signal is the negative edge pulse signal. Thus, decoding may be performed according to a pulse width or a number of pulse waves of the set signal in the programming mode, and the switch is controlled according to the positive and negative edge pulse signals in the working mode, thereby achieving the effects of switching between functions of decoding the input signal and switching the switch on or off.

In an example, the set unit receives the positive edge pulse signal, and when the enabling signal is at the high level or the low level, the set signal outputted by the set unit is the positive edge pulse signal. The reset unit receives the enabling signal and the negative edge pulse signal, when the enabling signal is at the low level, the reset signal outputted by the reset unit is maintained at the high level, and when the enabling signal is at the high level, the reset signal is the negative edge pulse signal. Thus, decoding may be performed according to a number of pulse waves of the set signal in the programming mode, and the switch is controlled according to the positive and negative pulse signals in the working mode, thereby achieving the effects of switching between functions of decoding the input signal and switching the switch on or off.

In an example, the set unit receives the enabling signal and the positive edge pulse signal, when the enabling signal is at the low level, the set signal outputted by the set unit is maintained at the low level, and when the enabling signal is at the high level, the set signal is the positive edge pulse signal. The reset unit receives the input signal, the enabling signal, and the negative edge pulse signal, when the enabling signal is at the low level, the reset signal outputted by the reset unit is the input signal, and when the enabling signal is at the high level, the reset signal is the negative edge pulse signal. Thus, decoding may be performed according to a pulse width or a number of pulse waves of the reset signal in the programming mode, and the switch is controlled according to the positive and negative pulse signals in the working mode, thereby achieving the effects of switching between functions of decoding the input signal and switching the switch on or off.

In an example, the set unit receives the enabling signal and the positive edge pulse signal, when the enabling signal is at the low level, the set signal outputted by the set unit is maintained at the low level, and when the enabling signal is at the high level, the set signal is the positive edge pulse signal. The reset unit receives the negative edge pulse signal, when the enabling signal is at the high level or the low level, the reset signal outputted by the reset unit is the negative edge pulse signal. Thus, decoding may be performed according to a number of pulse waves of the reset signal in the programming mode, and the switch is controlled according to the positive and negative pulse signals in the working mode, thereby achieving the effects of switching between functions of decoding the input signal and switching the switch on or off.

In an example, the control module is further provided with a comparison unit. The comparison unit receives the enabling signal and is coupled with the set unit and the reset unit, respectively. The comparison unit sets a high level and a low level for comparing with the enabling signal, when the enabling signal is between the low level and the high level, a comparison signal outputted by the comparison unit is at the low level, and when the enabling signal is at a level lower than the low level or higher than the high level, the comparison signal is at the high level, and the set unit or the reset unit receives the comparison signal. Thus, the comparison unit outputs the comparison signal according to the level of the enabling signal, thereby achieving the effect of providing more options of the circuit.

In an example, the pulse control unit receives the enabling signal, when the enabling signal is at the low level, the pulse control unit stops outputting the positive edge pulse signal and the negative edge pulse signal. Thus, the level of the enabling signal may control the pulse output of the circuit, thereby achieving the effect of increasing the circuit control function.

In an example, when the enabling signal is at a level lower than the low level, the half-bridge circuit driving chip is in a sleep mode, and the set signal outputted by the set unit and the reset signal outputted by the reset unit are both at the low level. When the enabling signal is between the low level and the high level, the half-bridge circuit driving chip is in the programming mode. When the enabling signal is at a level higher than the high level, the half-bridge circuit driving chip is in the working mode. Thus, switching among the programming mode, the working mode, and the sleep mode may be achieved, thereby achieving the effect of improving the controllability of the driving chip.

In an example, the half-bridge circuit driving chip further includes a low-side driving unit. The low-side driving unit receives the enabling signal and the comparison signal. When the comparison signal is at the high level, the half-bridge circuit driving chip is in the working mode, and the low-side driving unit outputs a low-side output signal according to the enabling signal. When the comparison signal is at the low level, the half-bridge circuit driving chip is in the programming mode, and the low-side output signal is maintained at the low level. Thus, the low-side output signal may be additionally generated for controlling the on or off of another low-side switch, thereby achieving the effect of increasing the circuit control function.

In an example, the programming module is provided with a decoding unit and a preset unit coupled with the decoding unit. The decoding unit receives the relative reset signal and the relative set signal, performs decoding according to a pulse width or a number of pulse waves of the signals, and outputs decoded signals to the preset unit. The preset unit outputs the circuit parameter. Thus, the data decoded by the decoding unit may correspond to the preset circuit parameter, and the circuit parameter may be parameters such as time delay, voltage, current, and the like for adjusting and programming circuit functions, thereby achieving the effect of driving the chip.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 1:
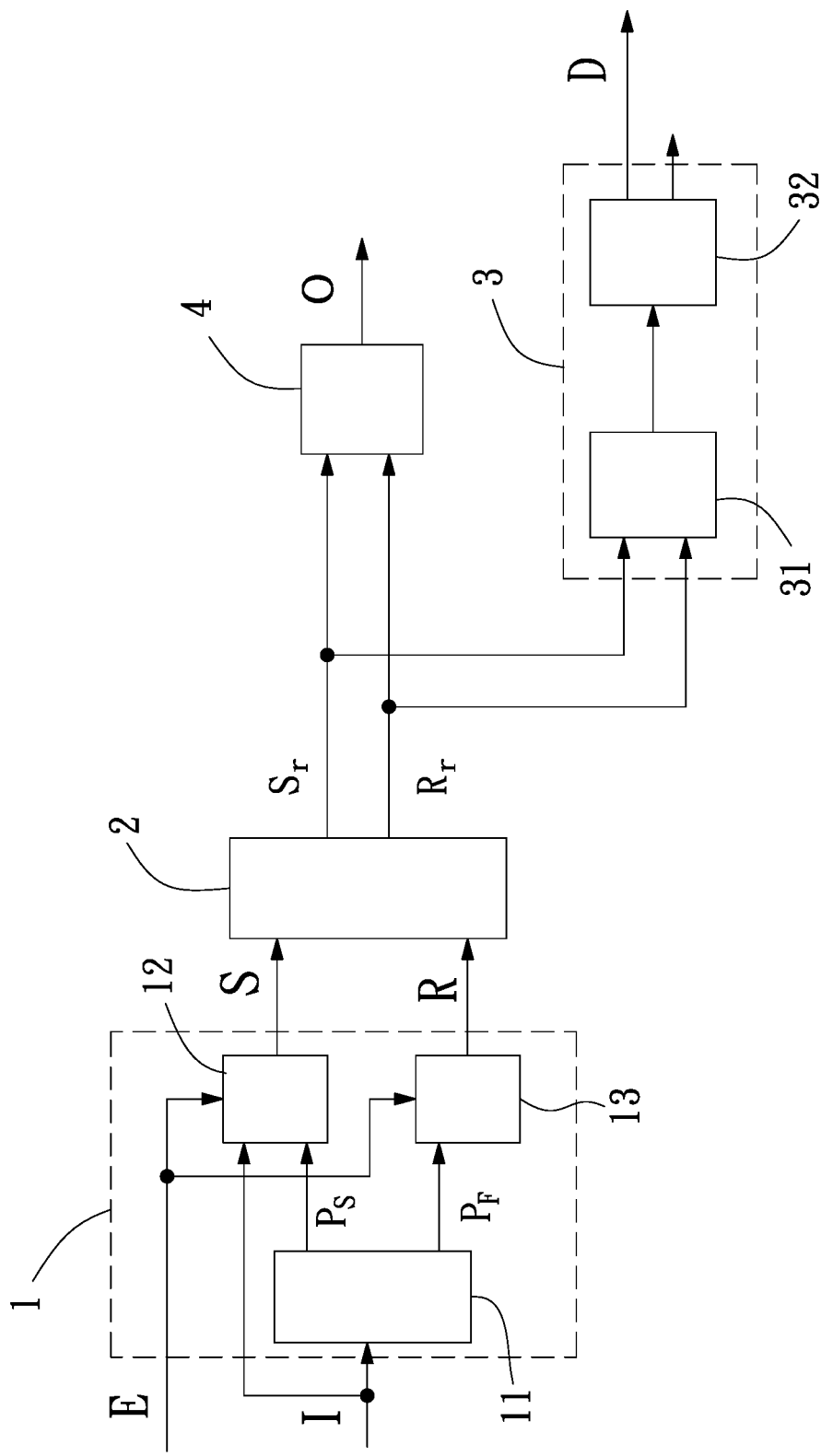
FIG. 1 is a circuit diagram according to a first embodiment of the present invention.

FIG. 1 shows a first embodiment of a half-bridge circuit driving chip according to the present invention. The half-bridge circuit driving chip includes a control module 1, a level shift unit 2, a programming module 3, and a driving unit 4. The control module 1 is coupled with the level shift unit 2. The level shift unit 2 is coupled with the programming module 3 and the driving unit 4, respectively. The control module 1 receives an enabling signal E and an input signal I. The control module 1 outputs a set signal S and a reset signal R to the level shift unit 2, respectively. The level shift unit 2 outputs a relative set signal $S_r$ and a relative reset signal $R_r$ to the programming module 3 and the driving unit 4. The programming module 3 outputs a circuit parameter D. The driving unit 4 outputs an output signal O.

Figure 2:
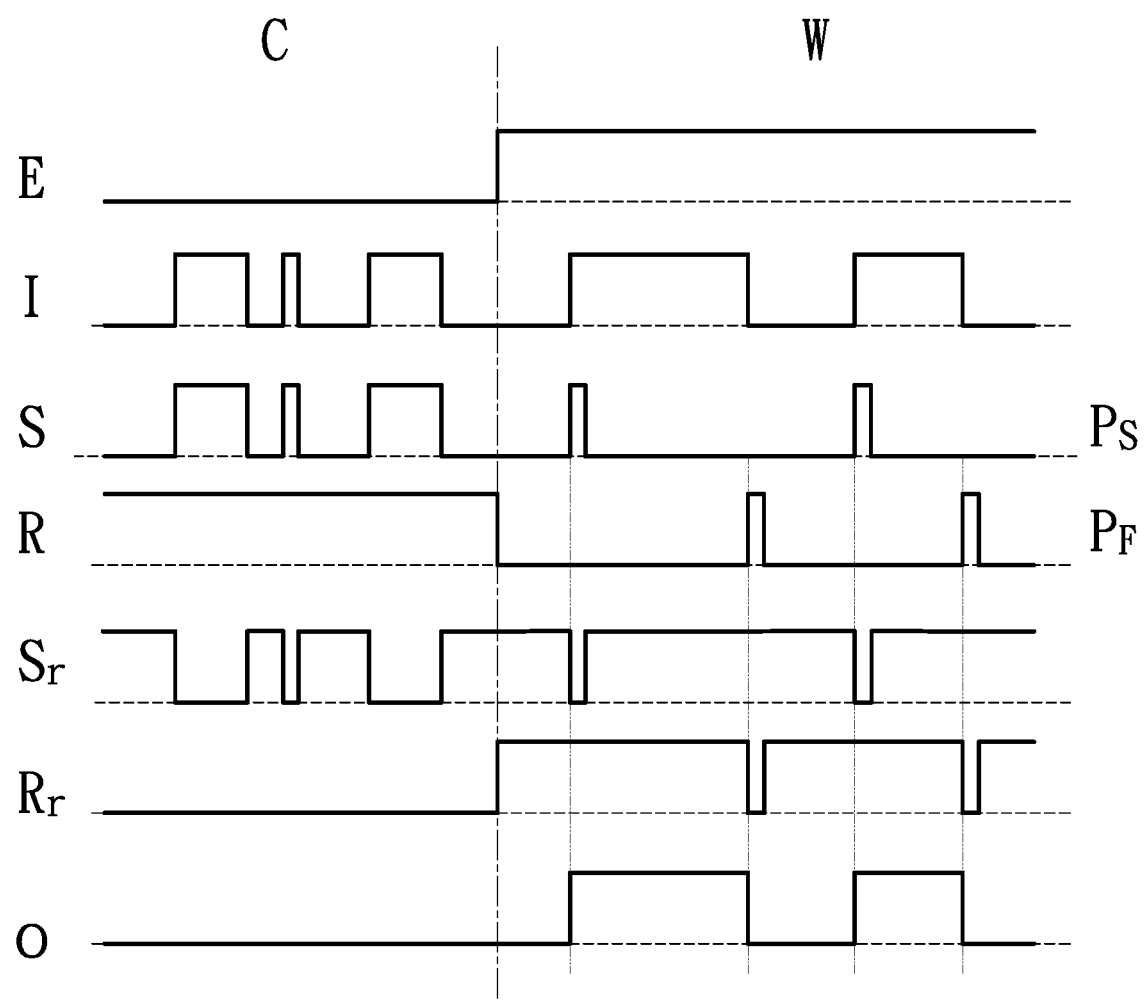
FIG. 2 is a timing diagram of each signal as shown in FIG. 1.

The control module 1 is provided with a pulse control unit 11. The pulse control unit 11 may receive the input signal I and generate a positive edge pulse signal $P_S$ and a negative edge pulse signal $P_F$ according to the input signal I. Specifically, at the moment when the input signal I is transitioned from a low level to a high level, the positive edge pulse signal $P_S$ forms a pulse; and at the moment when the input signal I is transitioned from the high level to the low level, the negative edge pulse signal $P_F$ forms a pulse. The pulse control unit 11 may also be coupled with a set unit 12 and a reset unit 13 respectively. The set unit 12 outputs the set signal S, and the reset unit 13 outputs the reset signal R. In this embodiment, the set unit 12 receives the input signal I, the enabling signal E, and the positive edge pulse signal $P_S$. Referring to FIG. 2, which is a timing diagram of each signal above, when the enabling signal E is at the low level, the set signal S outputted by the set unit 12 is the input signal I; and when the enabling signal E is at the high level, the set signal S is the positive edge pulse signal $P_S$. The reset unit 13 receives the enabling signal E and the negative edge pulse signal $P_F$. As shown in FIG. 2, when the enabling signal E is at the low level, the reset signal R outputted by the reset unit 13 is maintained at the high level; and when the enabling signal E is at the high level, the reset signal R is the negative edge pulse signal $P_F$.

The level shift unit 2 receives the set signal S and the reset signal R, and exchanges high and low levels of the set signal S and the reset signal R, thereby generating the relative set signal $S_r$ and the relative reset signal $R_r$, respectively. For example, as shown in FIG. 2, when the enabling signal E is at the low level, the reset signal R is maintained at the high level, and the relative reset signal $R_r$ is maintained at the low level.

The programming module 3 is configured to execute a programming mode C. When the enabling signal E is at the low level, the programming module 3 may be coupled with the level shift unit 2 through a decoding unit 31, and receives the relative reset signal $R_r$ and the relative set signal $S_r$ at the low level. The decoding unit 31 may perform decoding according to a pulse width or a number of pulse waves of the input signal I included in the relative set signal $S_r$. In this embodiment, the decoding unit 31 is a single wire decoder. In addition, the decoding unit 31 is coupled with a preset unit 32. The preset unit 32 enables data decoded by the decoding unit 31 to correspond to the preset circuit parameter D. The circuit parameter D may be parameters such as time delay, voltage, and current for adjusting and programming circuit functions. The circuit parameter D may be used for driving a control function inside the chip and may also be used for a circuit outside the chip. In addition, when the enabling signal E is at the high level, the relative reset signal $R_r$ is not at the low level, so that the programming module 3 stops programming, and the circuit parameter D remains unchanged.

The driving unit 4 is configured to execute a working mode W. When the enabling signal E is at the high level, the driving unit 4 may receive the relative reset signal $R_r$ and the relative set signal $S_r$. The relative reset signal $R_r$ is the negative edge pulse signal $P_F$ with high and low levels exchanged. The relative set signal $S_r$ is the positive edge pulse signal $P_S$ with high and low levels exchanged. The driving unit 4 may generate the output signal O according to the relative reset signal $R_r$ and the relative set signal $S_r$, and is configured to control a switch to be turned on or off. As shown in FIG. 2, when the relative set signal $S_r$ forms a pulse, the output signal O is switched from the low level to the high level; when the relative reset signal $R_r$ forms a pulse, the output signal O is switched from the high level to the low level. The driving unit 4 may output the output signal O in the same square wave width as the input signal I in the working mode W. In addition, when the enabling signal E is at the low level, the relative reset signal $R_r$ is maintained at the low level, and the driving unit 4 is in a reset state. No matter how the input signal I or the relative set signal $S_r$ changes, the output signal O is maintained at the low level.

Figure 3:
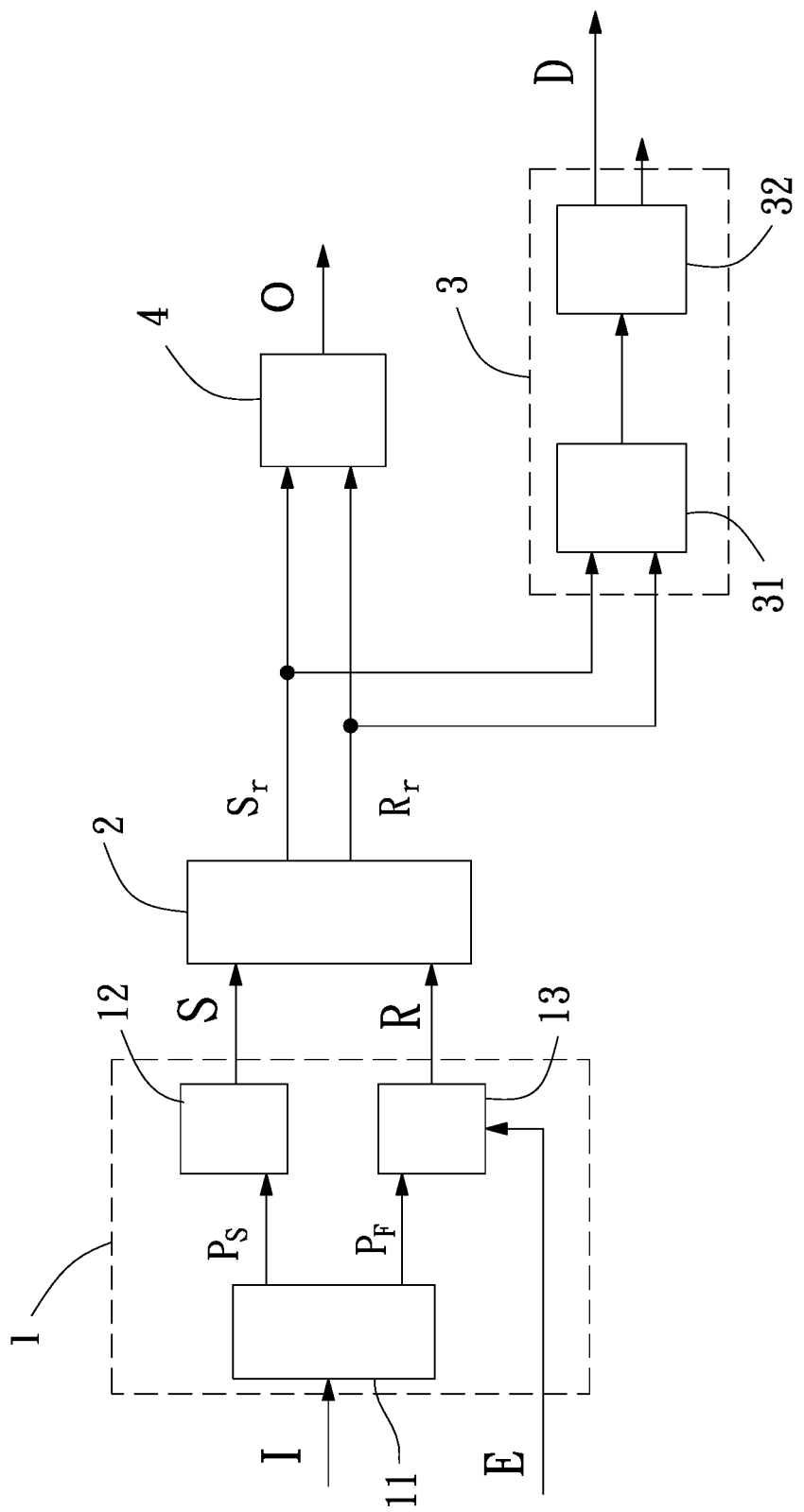
FIG. 3 is a circuit diagram according to a second embodiment of the present invention.
Figure 4:
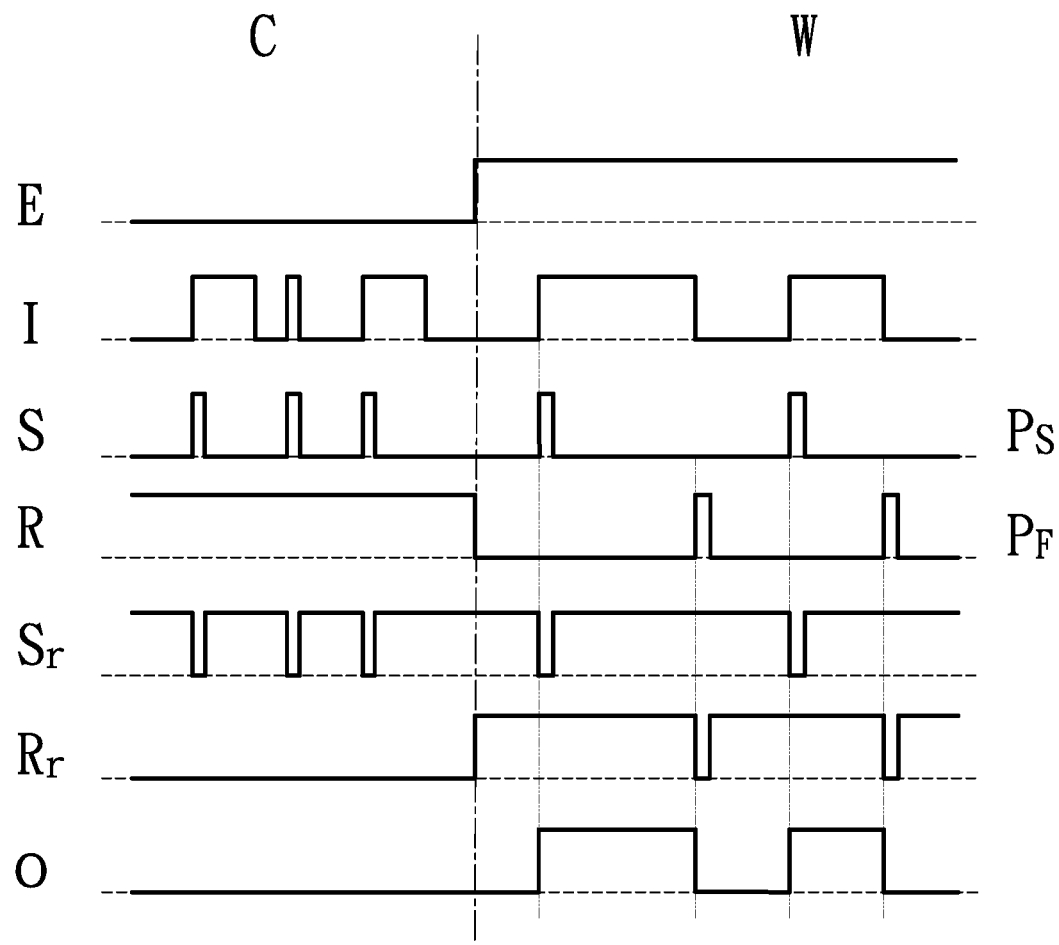
FIG. 4 is a timing diagram of each signal as shown in FIG. 3.

FIG. 3 and FIG. 4 respectively show a second embodiment of a half-bridge circuit driving chip according to the present invention and a signal timing diagram thereof. This embodiment is basically the same as the first embodiment. In this embodiment, the set unit 12 only receives the positive edge pulse signal $P_S$. As shown in FIG. 4, when the enabling signal E is at the high level or the low level, the set signals S outputted by the set unit 12 are all the positive edge pulse signals $P_S$. When the enabling signal E is at the low level, the half-bridge circuit driving chip is switched to the programming mode C. The decoding unit 31 may perform decoding according to a number of pulse waves of the positive edge pulse signals $P_S$ included in the relative set signal $S_r$. The driving unit 4 is in the reset state, and the output signal O is maintained at the low level. When the enabling signal E is at the high level, the half-bridge circuit driving chip is switched to the working mode W. The driving unit 4 may generate the output signal O according to the relative reset signal $R_r$ and the relative set signal $S_r$. The programming module 3 stops programming, and the circuit parameter D remains unchanged.

Figure 5:
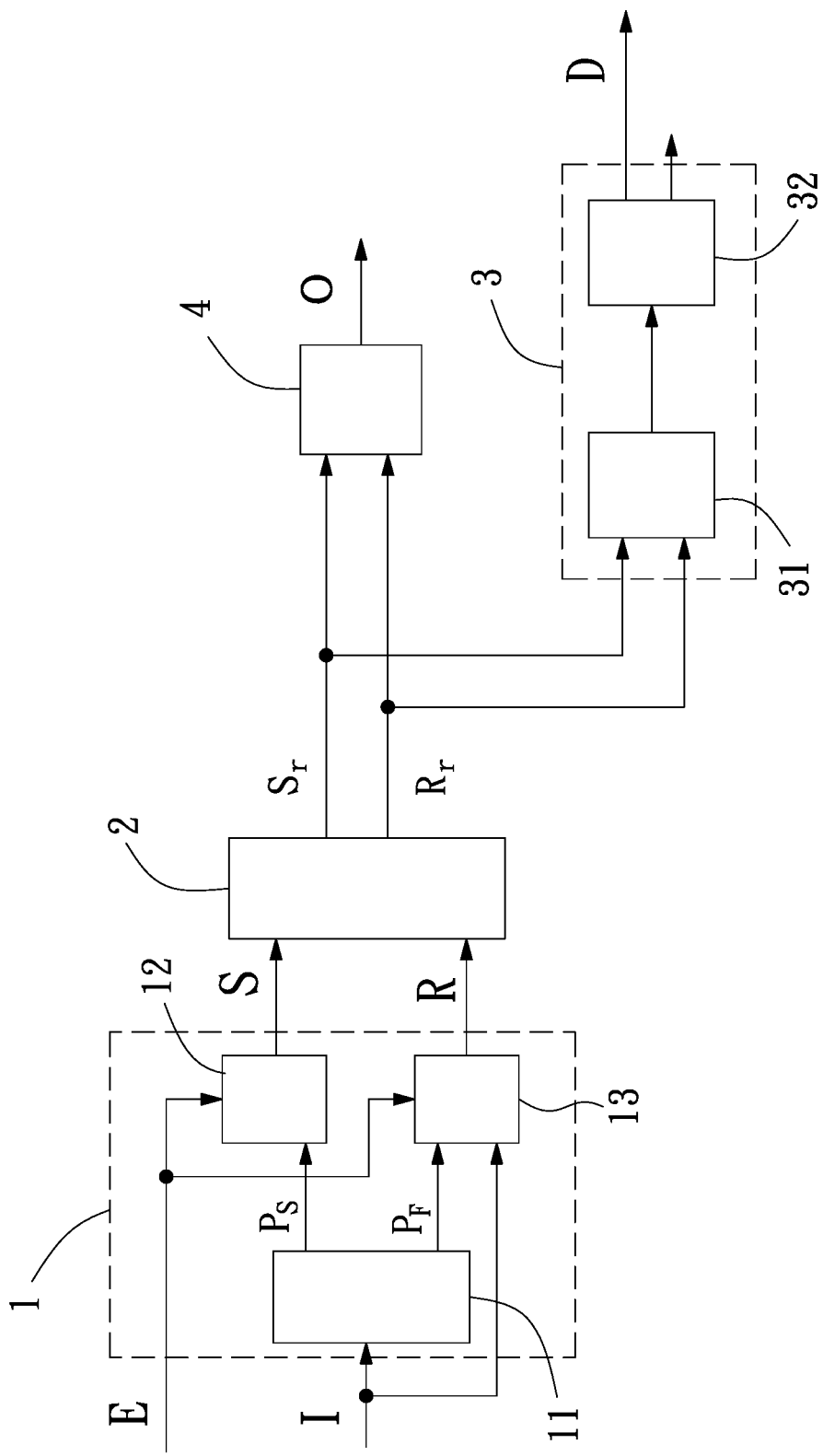
FIG. 5 is a circuit diagram according to a third embodiment of the present invention.
Figure 6:
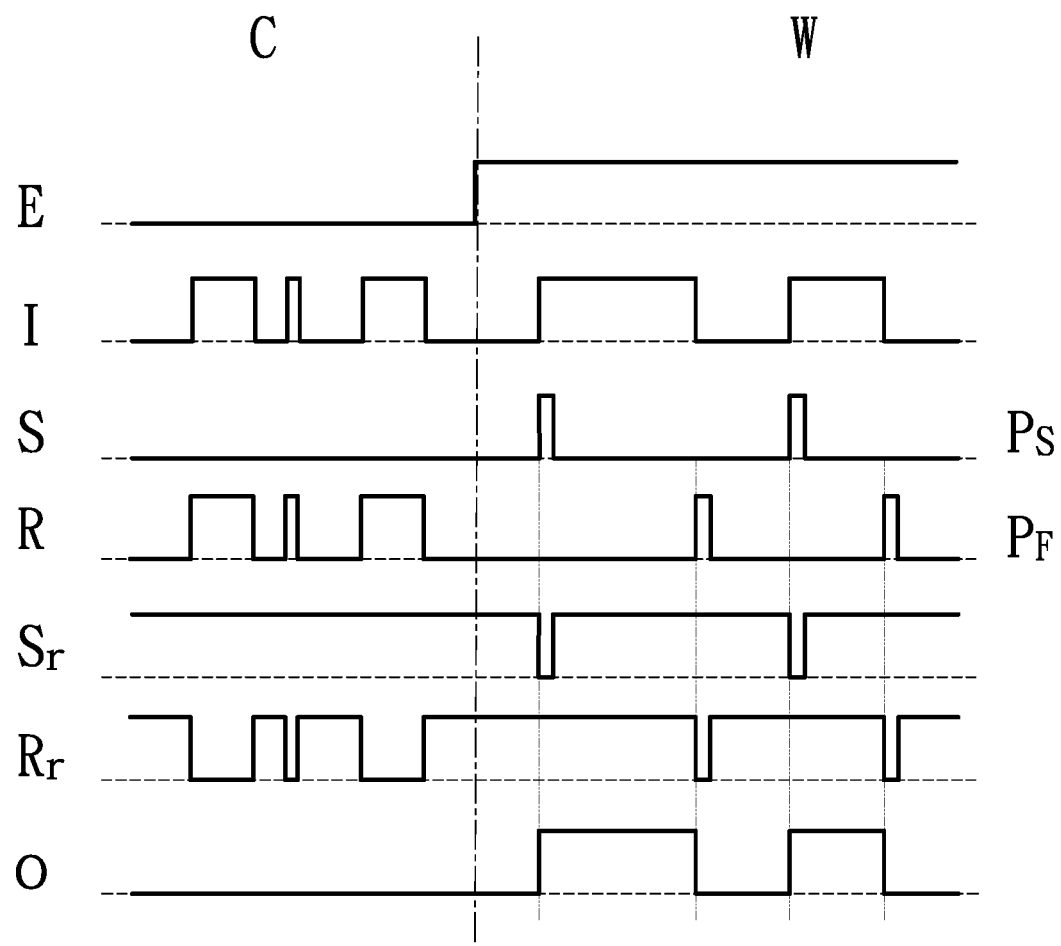
FIG. 6 is a timing diagram of each signal as shown in FIG. 5.

FIG. 5 and FIG. 6 respectively show a third embodiment of a half-bridge circuit driving chip according to the present invention and a signal timing diagram thereof. This embodiment is basically the same as the first embodiment. In this embodiment, the set unit 12 receives the enabling signal E and the positive edge pulse signal $P_S$. As shown in FIG. 6, when the enabling signal E is at the low level, the set signal S outputted by the set unit 12 is maintained at the low level; when the enabling signal E is at the high level, the set signal S is the positive edge pulse signal $P_S$. The reset unit 13 receives the input signal I, the enabling signal E, and the negative edge pulse signal $P_F$. As shown in FIG. 6, when the enabling signal E is at the low level, the reset signal R outputted by the reset unit 13 is the input signal I; and when the enabling signal E is at the high level, the reset signal R is the negative edge pulse signal $P_F$. When the enabling signal E is at the low level, the half-bridge circuit driving chip is switched to the programming mode C. The decoding unit 31 may perform decoding according to a pulse width or a number of pulse waves of the negative edge pulse signal $P_F$ included in the relative reset signal $R_r$. The driving unit 4 is in the reset state, and the output signal O is maintained at the low level. When the enabling signal E is at the high level, the half-bridge circuit driving chip is switched to the working mode W. The driving unit 4 may generate the output signal O according to the relative reset signal $R_r$ and the relative set signal $S_r$. The programming module 3 stops programming, and the circuit parameter D remains unchanged.

Figure 7:
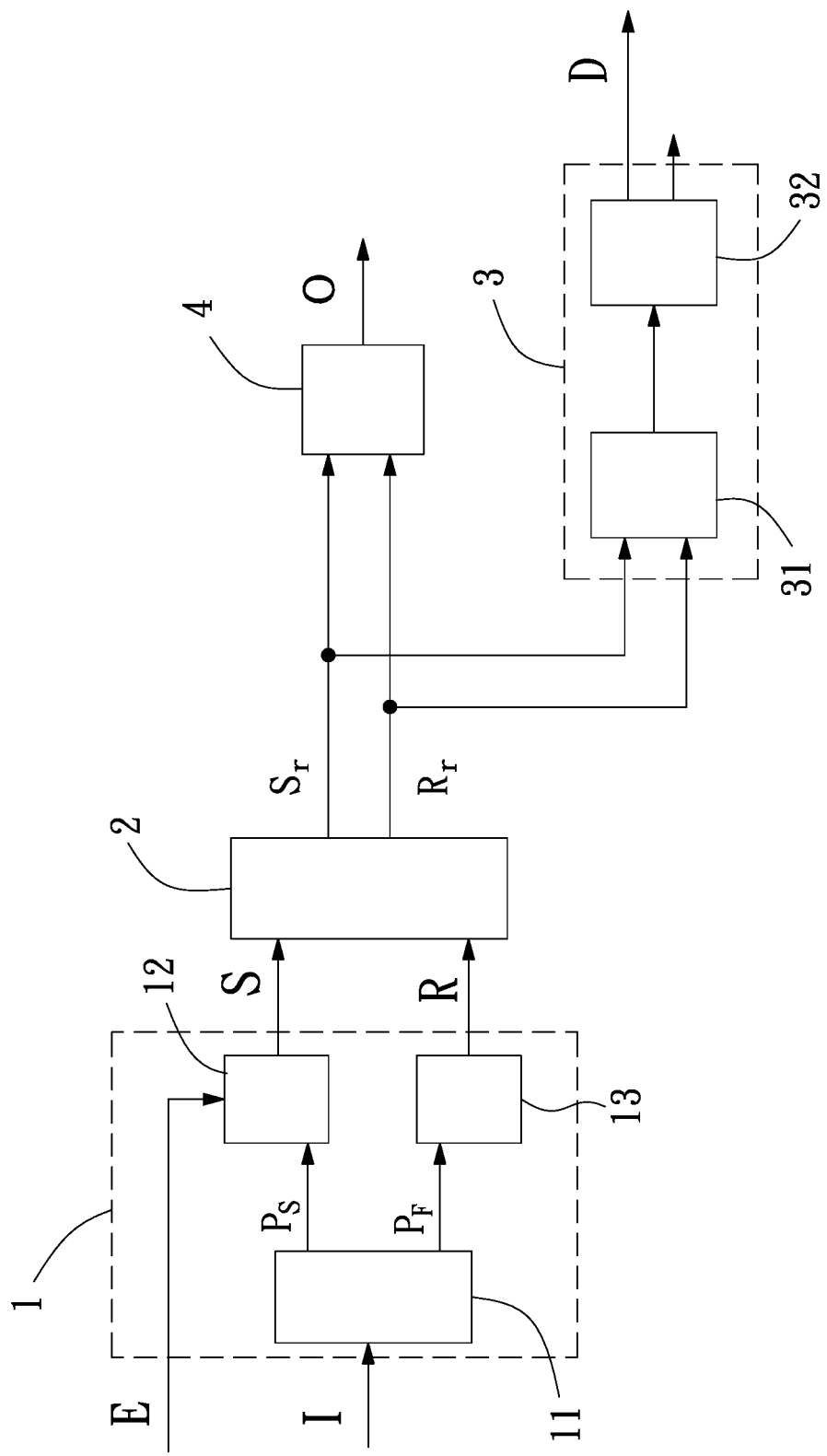
FIG. 7 is a circuit diagram according to a fourth embodiment of the present invention.
Figure 8:
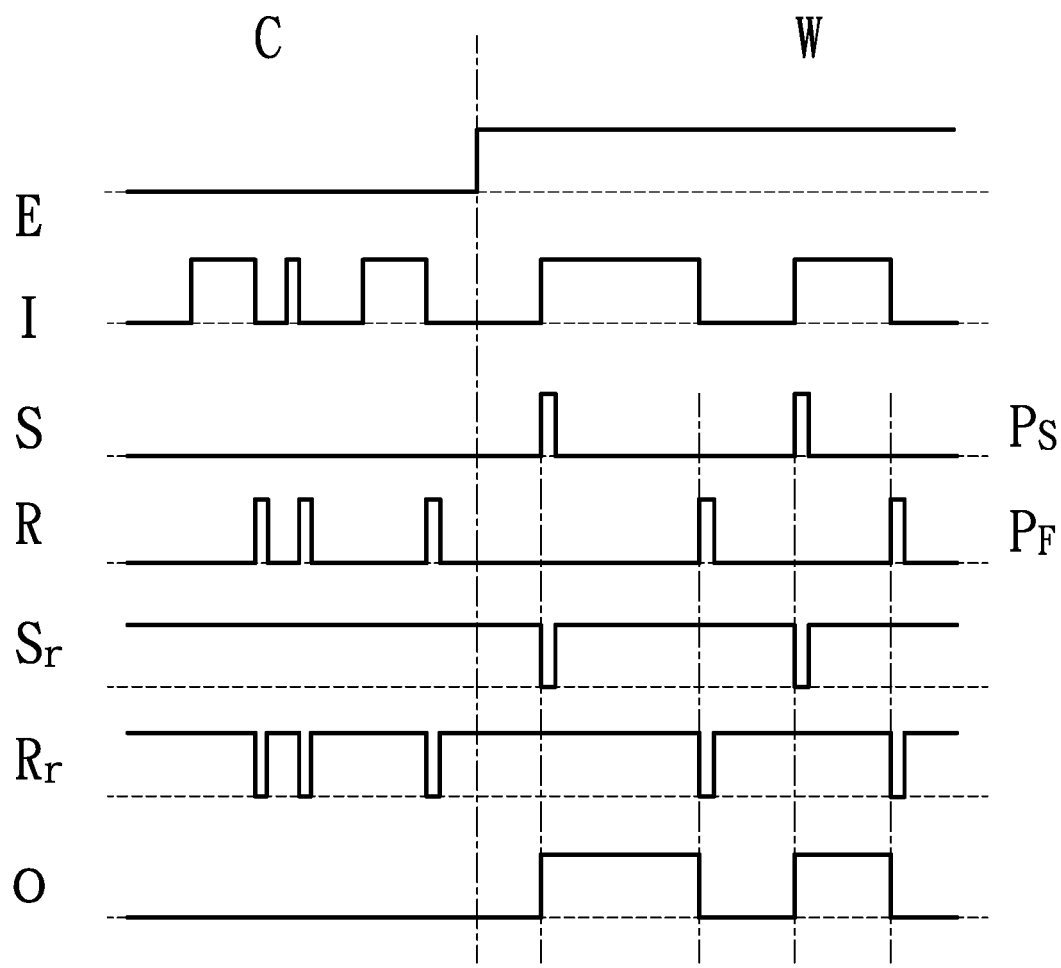
FIG. 8 is a timing diagram of each signal as shown in FIG. 7.

FIG. 7 and FIG. 8 respectively show a fourth embodiment of a half-bridge circuit driving chip according to the present invention and a signal timing diagram thereof. This embodiment is basically the same as the first embodiment. In this embodiment, the set unit 12 receives the enabling signal E and the positive edge pulse signal $P_S$. As shown in FIG. 8, when the enabling signal E is at the low level, the set signal S outputted by the set unit 12 is maintained at the low level; when the enabling signal E is at the high level, the set signal S is the positive edge pulse signal $P_S$. The reset unit 13 only receives the negative edge pulse signal $P_F$. As shown in FIG. 8, when the enabling signal E is at the high level or the low level, the reset signals R outputted by the reset unit 13 are all the negative edge pulse signals $P_F$. When the enabling signal E is at the low level, the half-bridge circuit driving chip is switched to the programming mode C. The decoding unit 31 may perform decoding according to a number of the pulse waves of the negative edge pulse signals $P_F$ included in the relative reset signals $R_r$. The driving unit 4 is in the reset state, and the output signal O is maintained at the low level. When the enabling signal E is at the high level, the half-bridge circuit driving chip is switched to the working mode W. The driving unit 4 may generate the output signal O according to the relative reset signals $R_r$ and the relative set signal $S_r$. The programming module 3 stops programming, and the circuit parameter D remains unchanged.

Figure 9:
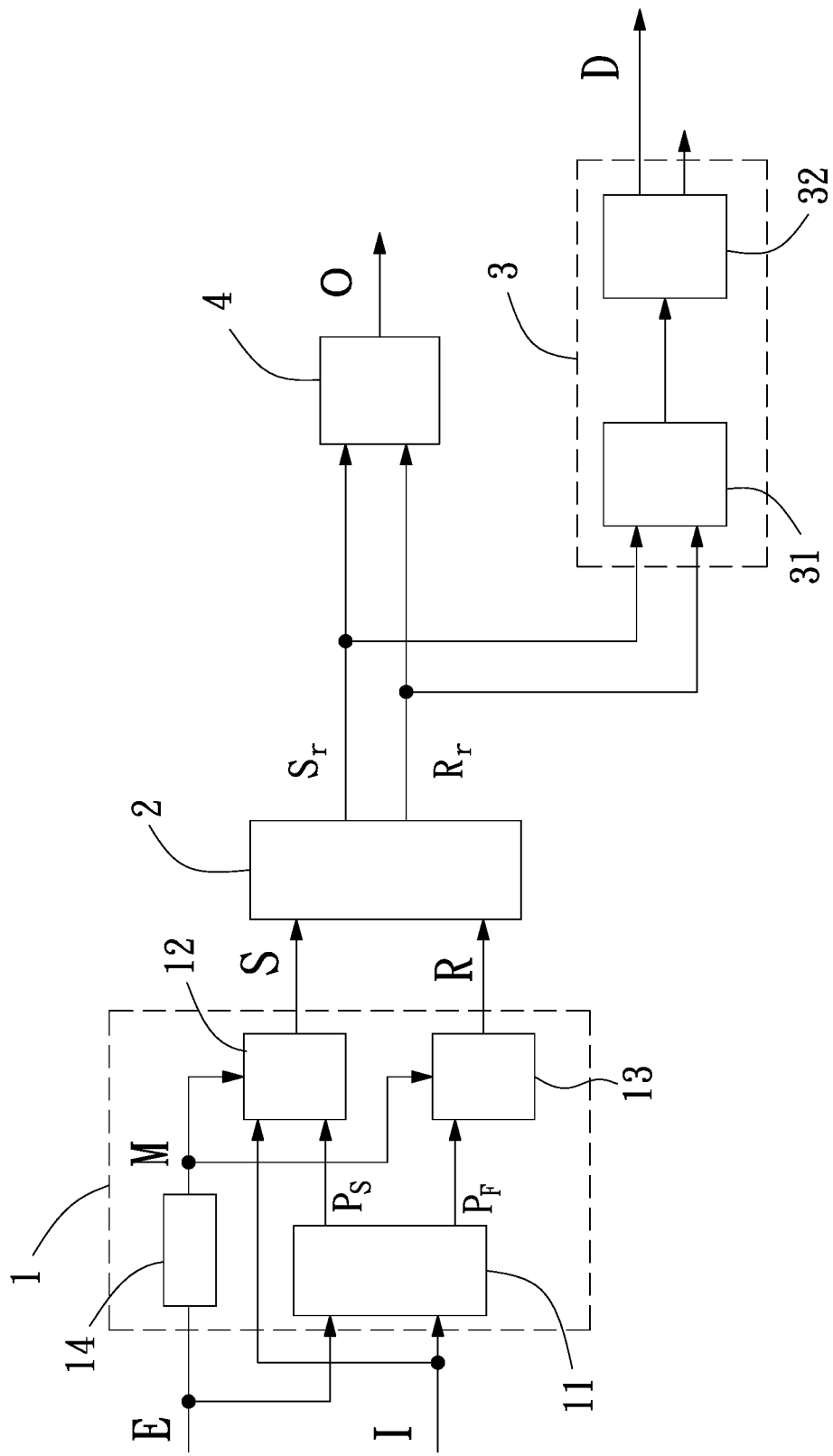
FIG. 9 is a circuit diagram according to a fifth embodiment of the present invention.
Figure 10:
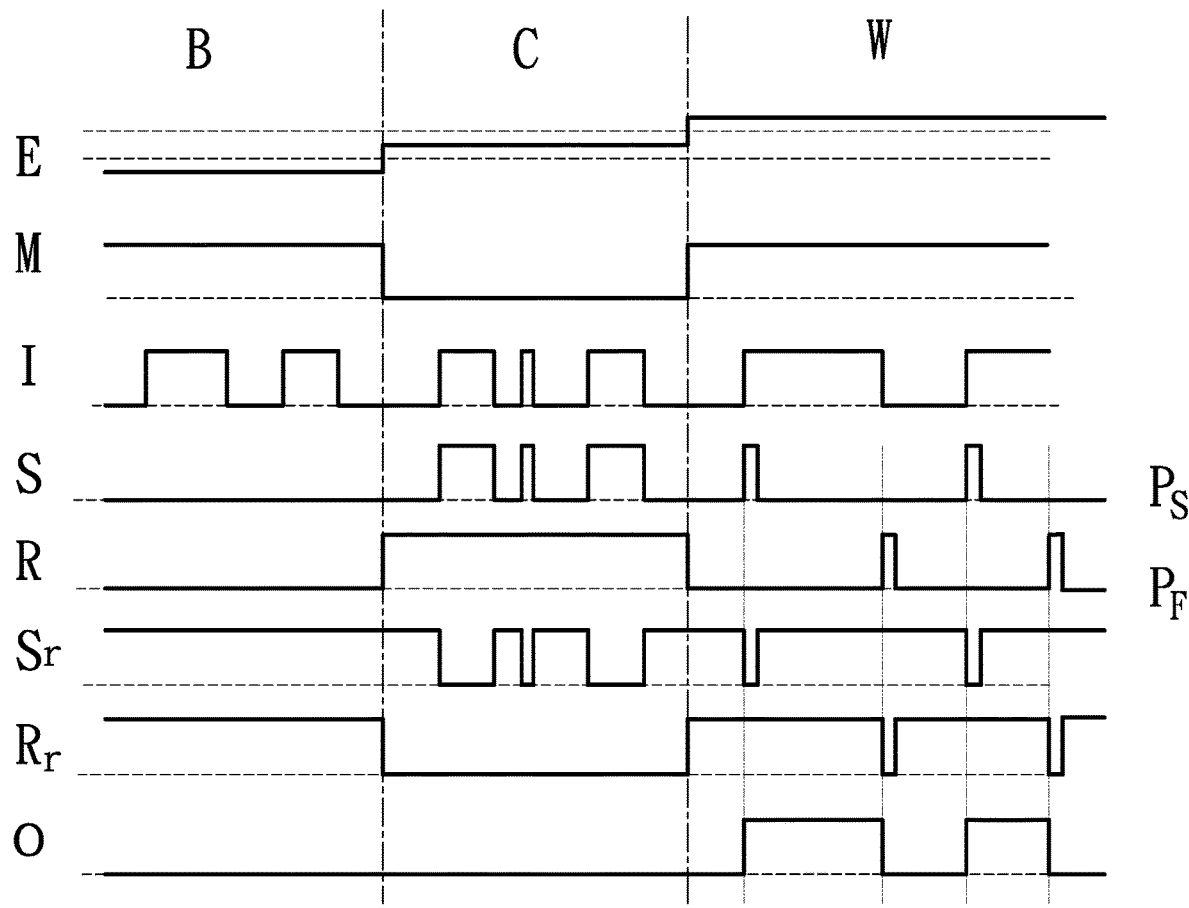
FIG. 10 is a timing diagram of each signal as shown in FIG. 9.

FIG. 9 and FIG. 10 respectively show a fifth embodiment of a half-bridge circuit driving chip according to the present invention and a signal timing diagram thereof. This embodiment is basically the same as the first embodiment. In this embodiment, the control module 1 is further provided with a comparison unit 14. The comparison unit 14 receives the enabling signal E and is coupled with the set unit 12 and the reset unit 13, respectively. The comparison unit 14 may set a high level and a low level for comparing with the enabling signal E. When the enabling signal E is between the low level and the high level, a comparison signal M outputted by the comparison unit 14 is at the low level; and when the enabling signal E is at a level lower than the low level or higher than the high level, the comparison signal M is at the high level. In addition, the pulse control unit 11 may receive the enabling signal E. When the enabling signal E is at the low level, the pulse control unit 11 stops outputting the positive edge pulse signal $P_S$ and the negative edge pulse signal $P_F$. Furthermore, the set unit 12 receives the input signal I, the comparison signal M, and the positive edge pulse signal $P_S$. The reset unit 13 receives the comparison signal M and the negative edge pulse signal $P_F$.

As shown in FIG. 10, when the enabling signal E is at a level lower than the low level, the comparison signal M is at the high level, and the half-bridge circuit driving chip is in the sleep mode B. The set signal S outputted by the set unit 12 and the reset signal R outputted by the reset unit 13 are both at the low level, and the programming module 3 and the driving unit 4 are not triggered. When the enabling signal E is between the low level and the high level, the half-bridge circuit driving chip is in the programming mode C. The comparison signal M is at the low level. The set signal S is the input signal I. The reset signal R is at the high level. The decoding unit 31 may perform decoding according to a pulse width or a number of the pulse waves of the input signal I included in the relative set signal $S_r$. The driving unit 4 is in the reset state, and the output signal O is maintained at the low level. When the enabling signal E is at a level higher than the high level, the comparison signal M is at the high level, and the half-bridge circuit driving chip is in the working mode W. The set signal S is the positive edge pulse signal $P_S$. The reset signal R is the negative edge pulse signal $P_F$. The driving unit 4 may generate the output signal O according to the relative reset signal $R_r$ and the relative set signal $S_r$. The programming module 3 stops programming, and the circuit parameter D remains unchanged.

It should be noted that the comparison unit 14 according to the fifth embodiment and the comparison signal M outputted by the comparison unit 14 can be used in the first to fourth embodiments. The comparison signal M may replace the enabling signal E inputted to the set unit 12 and/or the reset unit 13. The pulse control unit 11 receives the enabling signal E. Thus, the half-bridge circuit driving chip according to the present invention may be switched to the sleep mode B in addition to the programming mode C and the working mode W. The above mentioned embodiments may be carried out independently or jointly according to use requirements, and the present invention is not limited by the types disclosed in the accompanying drawings of the embodiments.

Figure 11:
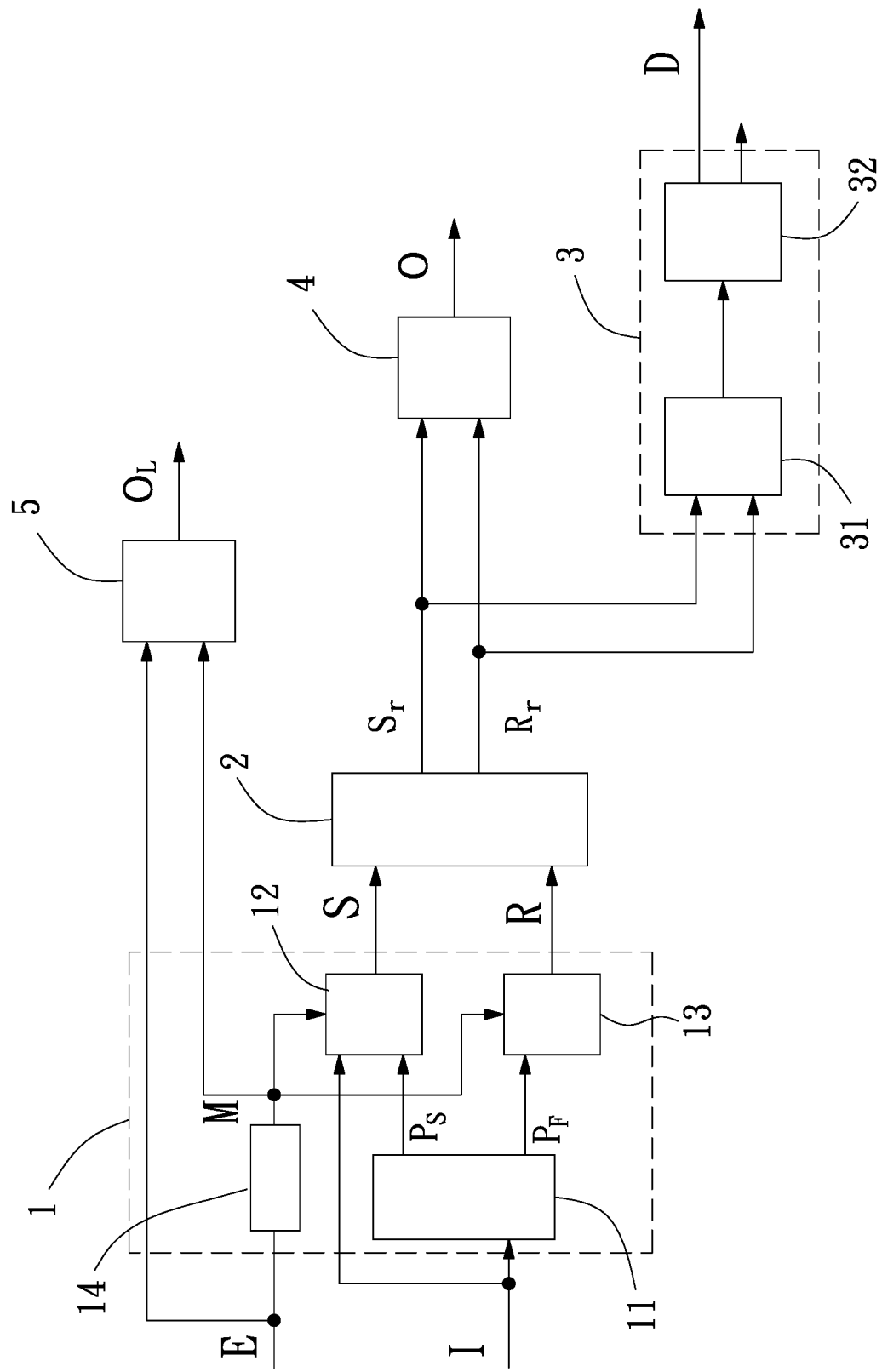
FIG. 11 is a circuit diagram according to a sixth embodiment of the present invention.
Figure 12:
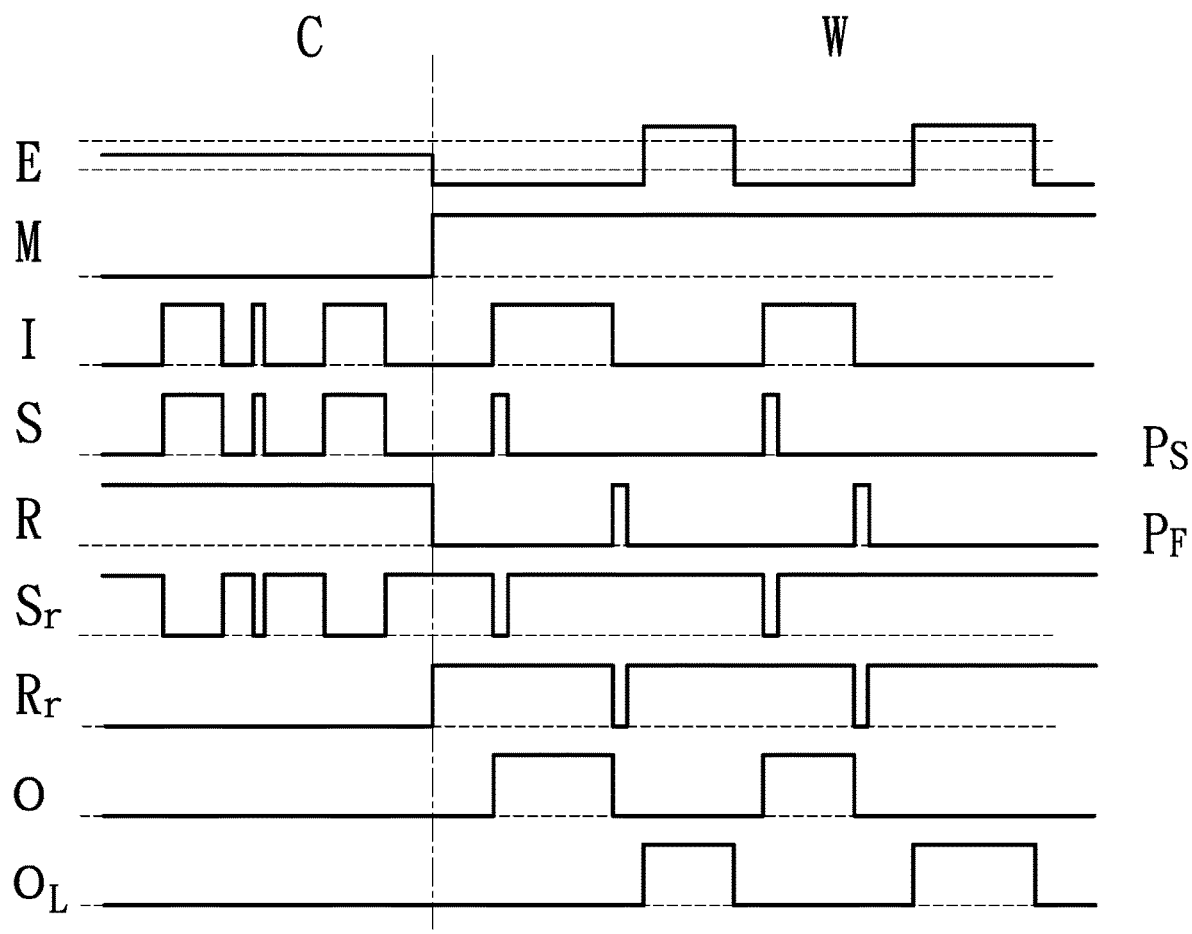
FIG. 12 is a timing diagram of each signal as shown in FIG. 11.

FIG. 11 and FIG. 12 respectively show a sixth embodiment of a half-bridge circuit driving chip according to the present invention and a signal timing diagram thereof. This embodiment is basically the same as the first embodiment. In this embodiment, the control module 1 is provided with the comparison unit 14. The comparison unit 14 receives the enabling signal E and is coupled with the set unit 12, the reset unit 13, and a low-side driving unit 5, respectively. When the enabling signal E is between the low level and the high level, the comparison unit 14 outputs the low-level comparison signal M; and when the enabling signal E is at a level lower than the low level or higher than the high level, the comparison signal M is at the high level. In addition, the set unit 12 receives the input signal I, the comparison signal M, and the positive edge pulse signal $P_S$. The reset unit 13 receives the comparison signal M and the negative edge pulse signal $P_F$. Furthermore, the low-side driving unit 5 receives the enabling signal E and the comparison signal M.

As shown in FIG. 12, when the enabling signal E is between the low level and the high level, the half-bridge circuit driving chip is in the programming mode C. The comparison signal M is at the low level. The set signal S is the input signal I. The reset signal R is at the high level. The decoding unit 31 may perform decoding according to a pulse width or a number of the pulse waves of the input signal I included in the relative set signal $S_r$. The driving unit 4 is in the reset state, and the output signal O is maintained at the low level. The low-side driving unit 5 is in the reset state and outputs a low-side output signal $O_L$ to maintain the low level. When the enabling signal E is at a level lower than the low level or higher than the high level, the comparison signal M is at the high level, and the half-bridge circuit driving chip is in the working mode W. The set signal S is the positive edge pulse signal $P_S$. The reset signal R is the negative edge pulse signal $P_F$. The driving unit 4 may generate the output signal O according to the relative reset signal $R_r$ and the relative set signal $S_r$. The low-side driving unit 5 may generate the low-side output signal $O_L$ according to the enabling signal E. The programming module 3 stops programming, and the circuit parameter D remains unchanged.

It should be noted that the low-side driving unit 5, the comparison unit 14, and the comparison signal M outputted by the comparison unit 14 according to the sixth embodiment can be used in the first to fourth embodiments. The comparison signal M may replace the enabling signal E inputted to the set unit 12 and/or the reset unit 13. The low-side driving unit 5 receives the enabling signal E and the comparison signal M. Thus, the half-bridge circuit driving chip may further generate the low-side output signal $O_L$ in the working mode W to control another low-side switch to be turned on or off. The above mentioned embodiments can be carried out independently or jointly according to use requirements, and the present invention is not limited by the types disclosed in the accompanying drawings of the embodiments.

Therefore, according to the half-bridge circuit driving chip in the present invention, programming signals are transmitted to the high-side circuit of the chip through the level shift unit, and the programming module is integrated in the high-side circuit to adjust and program the high-side circuit parameters. The chip performs decoding the programming signals in the input signal in the programming mode and switching the high-side switch on or off in the working mode, respectively. Accordingly, extra pins and electrical connection with external electronic elements are not needed, thereby achieving the effects of reducing the number of pins, reducing energy consumption of the chip, and reducing the complexity of a half-bridge circuit.

Although the present invention has been described with respect to the above preferred embodiments, these embodiments are not intended to restrict the present invention. Various changes and modifications on the above embodiments made by any person skilled in the art without departing from the spirit and scope of the present invention are still within the technical category protected by the present invention. Accordingly, the scope of the present invention shall include the literal meaning set forth in the appended claims and all changes which come within the range of equivalency of the claims. Furthermore, in a case that several of the above embodiments can be combined, the present invention includes the implementation of any combination.

What is claimed is:

1. A half-bridge circuit driving chip, comprising:
a control module configured to receive an enabling signal and an input signal, and output a set signal and a reset signal;
a level shift unit coupled with the control module, wherein the level shift unit is configured to receive the set signal and the reset signal, and output a relative set signal and a relative reset signal;
a programming module coupled with the level shift unit, wherein when the enabling signal is at a low level, the half-bridge circuit driving chip is in a programming mode, the programming module performs decoding according to the relative set signal and the relative reset signal, and outputs a circuit parameter, and wherein the circuit parameter remains unchanged when the enabling signal is at a high level; and
a driving unit coupled with the level shift unit, wherein when the enabling signal is at the high level, the half-bridge circuit driving chip is in a working mode, the driving unit generates an output signal according to the relative set signal and the relative reset signal, and wherein the output signal is maintained at the low level when the enabling signal is at the low level.

2. The half-bridge circuit driving chip as claimed in claim 1, wherein the control module is provided with a pulse control unit coupled with a set unit and a reset unit, respectively, and the pulse control unit generates a positive edge pulse signal and a negative edge pulse signal according to the input signal, and wherein the control module transmits the positive edge pulse signal and the negative edge pulse signal to the set unit and the reset unit, respectively.

3. The half-bridge circuit driving chip as claimed in claim 2, wherein the set unit receives the input signal, the enabling signal, and the positive edge pulse signal, wherein when the enabling signal is at the low level, the set signal outputted by the set unit is the input signal, and when the enabling signal is at the high level, the set signal is the positive edge pulse signal; and wherein the reset unit receives the enabling signal and the negative edge pulse signal, when the enabling signal is at the low level, the reset signal outputted by the reset unit is maintained at the high level, and when the enabling signal is at the high level, the reset signal is the negative edge pulse signal.

4. The half-bridge circuit driving chip as claimed in claim 2, wherein the set unit receives the positive edge pulse signal, and when the enabling signal is at the high level or the low level, the set signal outputted by the set unit is the positive edge pulse signal; and wherein the reset unit receives the enabling signal and the negative edge pulse signal, when the enabling signal is at the low level, the reset signal outputted by the reset unit is maintained at the high level, and when the enabling signal is at the high level, the reset signal is the negative edge pulse signal.

5. The half-bridge circuit driving chip as claimed in claim 2, wherein the set unit receives the enabling signal and the positive edge pulse signal, when the enabling signal is at the low level, the set signal outputted by the set unit is maintained at the low level, and when the enabling signal is at the high level, the set signal is the positive edge pulse signal; and wherein the reset unit receives the input signal, the enabling signal, and the negative edge pulse signal, when the enabling signal is at the low level, the reset signal outputted by the reset unit is the input signal, and when the enabling signal is at the high level, the reset signal is the negative edge pulse signal.

6. The half-bridge circuit driving chip as claimed in claim 2, wherein set unit receives the enabling signal and the positive edge pulse signal, when the enabling signal is at the low level, the set signal outputted by the set unit is maintained at the low level, and when the enabling signal is at the high level, the set signal is the positive edge pulse signal; and wherein the reset unit receives the negative edge pulse signal, when the enabling signal is at the high level or the low level, the reset signal outputted by the reset unit is the negative edge pulse signal.

7. The half-bridge circuit driving chip as claimed in claim 2, wherein the control module is further provided with a comparison unit; wherein the comparison unit receives the enabling signal and is coupled with the set unit and the reset unit, respectively; wherein the comparison unit sets a high level and a low level for comparing with the enabling signal, when the enabling signal is between the low level and the high level, a comparison signal outputted by the comparison unit is at the low level, and when the enabling signal is at a level lower than the low level or higher than the high level, the comparison signal is at the high level, and the set unit or the reset unit receives the comparison signal.

8. The half-bridge circuit driving chip as claimed in claim 7, wherein the pulse control unit receives the enabling signal, when the enabling signal is at the low level, the pulse control unit stops outputting the positive edge pulse signal and the negative edge pulse signal.

9. The half-bridge circuit driving chip as claimed in claim 8, wherein when the enabling signal is at a level lower than the low level, the half-bridge circuit driving chip is in a sleep mode, and the set signal outputted by the set unit and the reset signal outputted by the reset unit are both at the low level; when the enabling signal is between the low level and the high level, the half-bridge circuit driving chip is in the programming mode; and when the enabling signal is at a level higher than the high level, the half-bridge circuit driving chip is in the working mode.

10. The half-bridge circuit driving chip as claimed in claim 7, further comprising a low-side driving unit, wherein the low-side driving unit receives the enabling signal and the comparison signal; when the comparison signal is at the high level, the half-bridge circuit driving chip is in the working mode, and the low-side driving unit outputs a low-side output signal according to the enabling signal; and when the comparison signal is at the low level, the half-bridge circuit driving chip is in the programming mode, and the low-side output signal is maintained at the low level.

11. The half-bridge circuit driving chip as claimed in claim 1, wherein the programming module is provided with a decoding unit and a preset unit coupled with the decoding unit; wherein the decoding unit receives the relative reset signal and the relative set signal, performs decoding according to a pulse width or a number of pulse waves of the signals, and outputs decoded signals to the preset unit; and wherein the preset unit outputs the circuit parameter.

\* \* \* \* \*